(12) United States Patent
Takahashi et al.

(10) Patent No.: US 6,909,142 B2
(45) Date of Patent: Jun. 21, 2005

(54) SEMICONDUCTOR DEVICE INCLUDING A CHANNEL STOP STRUCTURE AND METHOD OF MANUFACTURING THE SAME

(75) Inventors: Hideki Takahashi, Tokyo (JP); Shinji Aono, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 30 days.

(21) Appl. No.: 10/133,422

(22) Filed: Apr. 29, 2002

(65) Prior Publication Data

US 2003/0080375 A1 May 1, 2003

(30) Foreign Application Priority Data

Oct. 30, 2001 (JP) ......................................... 2001-332712

(51) Int. Cl.⁷ .......................... H01L 29/76; H01L 29/94; H01L 31/062; H01L 31/113; H01L 31/119
(52) U.S. Cl. ..................... 257/330; 257/331; 257/332; 257/333; 257/334
(58) Field of Search ................................. 257/330–334

(56) References Cited

U.S. PATENT DOCUMENTS

| | | | | | |
|---|---|---|---|---|---|
| 5,168,331 A | * | 12/1992 | Yilmaz | ........................ | 257/331 |
| 5,233,215 A | * | 8/1993 | Baliga | ........................ | 257/490 |
| 5,316,959 A | * | 5/1994 | Kwan et al. | ................ | 438/270 |
| 5,349,218 A | * | 9/1994 | Tadaki et al. | ............... | 257/296 |
| 5,597,765 A | * | 1/1997 | Yilmaz et al. | .............. | 438/270 |
| 5,614,751 A | * | 3/1997 | Yilmaz et al. | .............. | 257/394 |
| 5,691,553 A | | 11/1997 | Mori et al. | | |
| 5,877,528 A | * | 3/1999 | So | .............................. | 257/341 |
| 5,898,199 A | | 4/1999 | Mori et al. | | |
| 5,907,776 A | * | 5/1999 | Hshieh et al. | .............. | 438/270 |
| 5,945,692 A | | 8/1999 | Yano et al. | | |
| 6,031,265 A | * | 2/2000 | Hshieh | ........................ | 257/334 |
| 6,154,113 A | | 11/2000 | Murai | | |
| 6,198,126 B1 | | 3/2001 | Mori et al. | | |
| 6,413,822 B2 | * | 7/2002 | Williams et al. | ............ | 438/270 |
| 6,445,048 B1 | * | 9/2002 | Pfirsch | ........................ | 257/393 |
| 6,475,884 B2 | * | 11/2002 | Hshieh et al. | .............. | 438/498 |
| 6,683,363 B2 | * | 1/2004 | Lee et al. | ................... | 257/496 |

FOREIGN PATENT DOCUMENTS

| | | |
|---|---|---|
| JP | 07-326744 | 12/1995 |
| JP | 08-088346 | 4/1996 |
| JP | 08-264787 | 10/1996 |
| JP | 8-264787 | 10/1996 |
| JP | 09-283754 | 10/1997 |
| JP | 2000-012350 | 1/2000 |
| JP | 2000-208768 | 7/2000 |
| JP | 2001-102572 | 4/2001 |

* cited by examiner

*Primary Examiner*—Michael S. Lebentritt
*Assistant Examiner*—Angel Roman
(74) *Attorney, Agent, or Firm*—Oblon, Spivak, McClelland, Maier & Neustadt, P.C.

(57) ABSTRACT

It is an object to obtain a semiconductor device comprising a channel stop structure which is excellent in an effect of stabilizing a breakdown voltage and a method of manufacturing the semiconductor device. A silicon oxide film (2) is formed on an upper surface of an N⁻-type silicon substrate (1). An N⁺-type impurity implantation region (4) is formed in an upper surface (3) of the N⁻-type silicon substrate (1) in a portion exposed from the silicon oxide film (2). A deeper trench (5) than the N⁺-type impurity implantation region (4) is formed in the upper surface (3) of the N⁻-type silicon substrate (1). A silicon oxide film (6) is formed on an inner wall of the trench (5). A polysilicon film (7) is formed to fill in the trench (5). An aluminum electrode (8) is formed on the upper surface (3) of the N⁻-type silicon substrate (1). The aluminum electrode (8) is provided in contact with an upper surface of the polysilicon film (7) and the upper surface (3) of the N⁻-type silicon substrate (1). The aluminum electrode (8) is extended over the silicon oxide film (2) to constitute a field plate.

7 Claims, 17 Drawing Sheets

| Qss | VCES |
|---|---|
| 0 | 418V |
| −1E11 | 448V |
| −1E12 | 77.7V |

| Qss | VCES |
|---|---|
| 0 | 418V |
| −1E11 | 448V |
| −1E12 | 532V |

| Qss | VCES |
|---|---|
| 0 | 417V |
| −1E11 | 445V |
| −1E12 | 589V |

| Qss | VCES |
|---|---|
| 0 | 415V |
| −1E11 | 443V |
| −1E12 | 605V |

F I G . 2 6
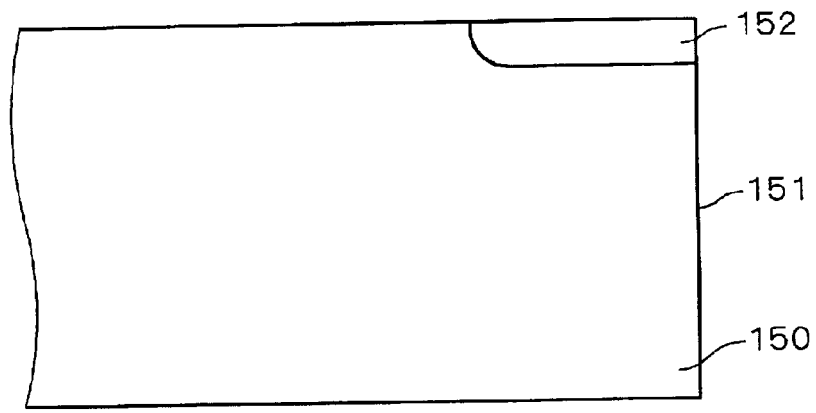
F I G . 2 7
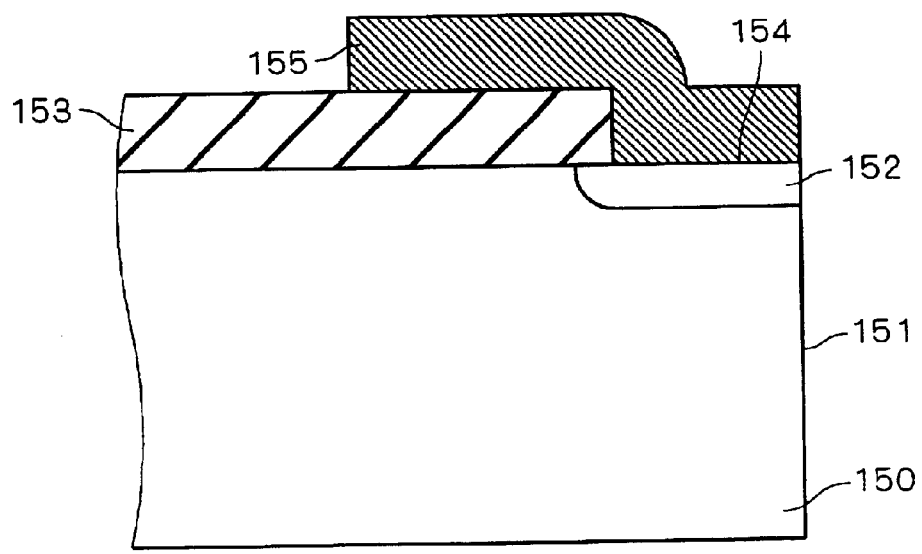

SEMICONDUCTOR DEVICE INCLUDING A CHANNEL STOP STRUCTURE AND METHOD OF MANUFACTURING THE SAME

BACKGROUND OF THE INVENTION

1. Field of the Invention

The present invention relates to a semiconductor device and a method of manufacturing the semiconductor device, and more particularly to a channel stop structure of a power device and a method of manufacturing the channel stop structure.

2. Description of the Background Art

In a peripheral region of a chip in which a power device such as a power MOSFET or an insulated gate type bipolar transistor is formed, there is formed a channel stop structure for preventing a depletion layer extended from a main junction from being provided over the peripheral region of the chip in order to maintain a breakdown voltage of a semiconductor device. By recent investigations, it has turned out that the channel stop structure is important to stabilize the breakdown voltage of the semiconductor device.

FIG. 26 is a sectional view showing a first conventional channel stop structure. An N$^+$-type impurity implantation region 152 in which an impurity such as phosphorus or arsenic is implanted in a high concentration is formed in an upper surface of an N$^-$-type silicon substrate 150 in the vicinity of an edge 151 (a peripheral portion) of a chip.

FIG. 27 is a sectional view showing a second conventional channel stop structure. A silicon oxide film 153 is formed on an upper surface of an N$^-$-type silicon substrate 150 excluding a peripheral portion of a chip. An N$^+$-type impurity implantation region 152 is formed in an upper surface 154 of the N$^-$-type silicon substrate 150 in a portion exposed from the silicon oxide film 153. An aluminum electrode 155 is formed on the upper surface 154 of the N$^-$-type silicon substrate 150. The aluminum electrode 155 is extended over the silicon oxide film 153 to constitute a field plate. Such a channel stop structure is employed in a semiconductor device in which a planer type bipolar transistor is formed, for example.

FIG. 28 is a sectional view showing a third conventional channel stop structure. A silicon oxide film 156 is formed on an upper surface of an N$^-$-type silicon substrate 150 excluding a peripheral portion of a chip. An N$^+$-type impurity implantation region 152 is formed in an upper surface 157 of the N$^-$-type silicon substrate 150 in a portion exposed from the silicon oxide film 156. A polysilicon film 158 is formed on the upper surface 157 of the N$^-$-type silicon substrate 150. The polysilicon film 158 is extended over the silicon oxide film 156 to constitute a first field plate. A part (the most peripheral portion) of the upper surface 157 of the N$^-$-type silicon substrate 150 is exposed from the polysilicon film 158.

Moreover, a silicon oxide film 159 is provided on the polysilicon film 158 in a portion formed on the silicon oxide film 156 and on the silicon oxide film 156 in a portion where the polysilicon film 158 is not formed. An aluminum electrode 160 is formed on the most peripheral portion of the upper surface 157 of the N$^-$-type silicon substrate 150. The aluminum electrode 160 is also provided in contact with the polysilicon film 158, and furthermore, is extended over the silicon oxide film 159 to constitute a second field plate. A channel stop structure having such a double field plate is employed in a semiconductor device in which a planer type MOSFET having a gate electrode formed of polysilicon is provided, for example.

FIG. 29 is a sectional view showing a fourth conventional channel stop structure. A silicon oxide film 161 is formed on an upper surface of an N$^-$-type silicon substrate 150 excluding a peripheral portion of a chip. An end on the edge 151 side of the silicon oxide film 161 has a small thickness. An N$^+$-type impurity implantation region 152 is formed in an upper surface 162 of the N$^-$-type silicon substrate 150 in a portion exposed from the silicon oxide film 161. A polysilicon film 163 is formed on the upper surface 162 of the N$^-$-type silicon substrate 150. The polysilicon film 163 is extended over the silicon oxide film 161 to constitute a first stepped field plate. The most peripheral portion of the upper surface 162 of the N$^-$-type silicon substrate 150 is exposed from the polysilicon film 163.

Moreover, a silicon oxide film 164 is formed on the polysilicon film 163 in a portion formed on the silicon oxide film 161 and on the silicon oxide film 161 in a portion where the polysilicon film 163 is not formed. An aluminum electrode 165 is formed on the most peripheral portion of the upper surface 162 of the N$^-$-type silicon substrate 150. The aluminum electrode 165 is also provided in contact with the polysilicon film 163, and furthermore, is extended over the silicon oxide film 164 to constitute a second field plate. In a semiconductor device in which a planer type MOSFET having a gate electrode formed of polysilicon is provided, recently, a channel stop structure having the double field plate shown in FIG. 29 has been employed.

FIG. 30 is a sectional view showing a fifth conventional channel stop structure (see Japanese Patent Application Laid-Open No. 8-264787 (1996)). A P$^-$-type epitaxial layer 201 is formed on a P$^+$-type substrate 200. A field oxide film 205 is formed on an upper surface of the P$^-$-type epitaxial layer 201 excluding an edge 202 portion of a chip. A P-type diffusion layer 207 is formed in the upper surface of the P$^-$-type epitaxial layer 201 in a portion exposed from the field oxide film 205.

A deeper trench 203 than the P-type diffusion layer 207 is formed in the upper surface of the P$^-$-type epitaxial layer 201 in a portion where the P-type diffusion layer 207 is provided. An insulating layer 204 having a smaller thickness than that of the field oxide film 205 and formed of oxide is provided on an inner wall of the trench 203 and on the upper surface of the P$^-$-type epitaxial layer 201 in a portion exposed from the field oxide film 205. Moreover, a doped polysilicon film 208 is formed to fill in the trench 203 provided with the insulating layer 204 and to be extended over the field oxide film 205 to constitute a field plate. Moreover, a BPSG layer 206 is formed to cover the doped polysilicon film 208 and the field oxide film 205.

In the publication described above, such a channel stop structure has been employed for a semiconductor device provided with a transistor having a trench formed in the upper surface of the P$^-$-type epitaxial layer 201 in an active portion, a gate oxide film formed on an inner wall of the trench, and a gate electrode formed of doped polysilicon provided to fill in the trench (that is, a trench type insulated gate).

The above-mentioned publication has described a problem of "channeling" in a P-channel type MOSFET. More specifically, there have been described "channeling depends on a quantity of fixed electric charges in an oxide film and in an upper surface portion of a substrate provided thereunder. The fixed electric charges of this kind are depleted at an oxidizing step. However, the depletion enables inversion (channeling) to be carried out." "This is caused by separation of boron from a main surface of the substrate at the oxidizing step and P-type electric charges in the main surface of the substrate are decreased due to the boron." and "It has been found that the boron to be a dopant becomes a problem."

As a solution of the channeling, the structure of FIG. 30 has been shown. There has been described that a thickness of the insulating layer 204 is made smaller than that of the field oxide film 205 and depletion of the boron from an upper portion of the P⁻-type epitaxial layer 201 to the insulating layer 204 is thereby made less than depletion to the field oxide film 205, resulting in suppression of the channeling.

However, the first to fourth conventional channel stop structures insufficiently produce the effect of preventing the depletion layer extended from the main junction from being formed over the peripheral region of the chip. As a result, there is a problem in that the effect of stabilizing the breakdown voltage of the semiconductor device is insufficient.

Referring to the fifth conventional channel stop structure, moreover, the above-mentioned publication has described only the case in which the P-type diffusion layer 207 is formed in the P⁻-type epitaxial layer 201. Therefore, there is a problem in that whether or not the same effects can be obtained is unknown if an N-type diffusion layer is formed in an N-type silicon substrate (including an N-type epitaxial layer). Differently from the P type, particularly, an N-type impurity is segregated into a surface of a silicon substrate at the oxidizing step in the case of the N type. Therefore, the channeling at the oxidizing step is not conceivable.

SUMMARY OF THE INVENTION

It is an object of the present invention to provide a semiconductor device including a transistor having a trench-type insulated gate, using an N-type semiconductor substrate and having a channel stop structure which is excellent in an effect of stabilizing a breakdown voltage, and a method of manufacturing the semiconductor device.

According to a first aspect of the present invention, the semiconductor device includes an N-type semiconductor substrate, a transistor and a channel stop structure. The transistor has a first P-type impurity introduced region which is formed in a main surface of the semiconductor substrate and constitutes a main junction together with the semiconductor substrate. The channel stop structure is formed in a peripheral portion of the semiconductor substrate, and has a first trench formed in the main surface of the semiconductor substrate.

In the semiconductor device, the channel stop structure has the first trench formed in the main surface of the semiconductor substrate. Consequently, a depletion layer extended from the main junction toward the peripheral portion of the semiconductor substrate can be suppressed by the first trench so that a breakdown voltage of the semiconductor device can be stabilized.

Preferably, in the semiconductor device, the channel stop structure further has a second N-type impurity introduced region formed in the main surface of the semiconductor substrate in a portion where the first trench is formed.

In the semiconductor device, the channel stop structure has the second N-type impurity introduced region formed in the main surface of the semiconductor substrate as well as the first trench. Consequently, the depletion layer extended from the main junction toward the peripheral portion of the semiconductor substrate can be further suppressed so that the breakdown voltage of the semiconductor device can be further stabilized.

Preferably, in the semiconductor device, the channel stop structure further has a first insulating film and a first conductive film. The first insulating film is formed on an inner wall of the first trench. The first conductive film is formed to fill in the first trench.

In the semiconductor device, the first conductive film is formed in the first trench through the first insulating film. Therefore, the effect of suppressing the depletion layer extended from the main junction can be enhanced so that the breakdown voltage of the semiconductor device can be further stabilized.

According to a second aspect of the present invention, the method of manufacturing a semiconductor device includes the steps (a)–(d) as follows. The step (a) is to prepare an N-type semiconductor substrate having a first region in which a transistor is to be formed and a second region in which a channel stop structure is to be formed. The step (b) is to form a first P-type impurity introduced region constituting a main junction together with the semiconductor substrate in a main surface of the semiconductor substrate in the first region. The step (c) is to form a first trench in the main surface of the semiconductor substrate in the second region.

In accordance with the method of manufacturing a semiconductor device, the channel stop structure has the first trench formed in the main surface of the semiconductor substrate. Consequently, a depletion layer extended from the main junction toward the peripheral portion of the semiconductor substrate can be suppressed by the first trench so that a breakdown voltage of the semiconductor device can be stabilized.

Preferably, the method of manufacturing a semiconductor device further includes the step (d) of forming a second N-type impurity introduced region in the main surface of the semiconductor substrate in the second region.

In accordance with the method of manufacturing a semiconductor device, the channel stop structure has the first trench formed in the main surface of the semiconductor substrate as well as the second N-type impurity introduced region. Consequently, the depletion layer extended from the main junction toward the peripheral portion of the semiconductor substrate can be suppressed by the first trench so that the breakdown voltage of the semiconductor device can be stabilized.

Preferably, the method of manufacturing a semiconductor device further includes the steps (e) and (f) as follows. The step (e) is to form a first insulating on an inner wall of the first trench. The step (f) is to form a first conductive film to fill in the first trench after the step (e).

In accordance with the method of manufacturing a semiconductor device, the first conductive film is formed in the first trench through the first insulating film. Therefore, the effect of suppressing the depletion layer extended from the main junction can be enhanced so that the breakdown voltage of the semiconductor device can be further stabilized.

These and other objects, features, aspects and advantages of the present invention will become more apparent from the following detailed description of the present invention when taken in conjunction with the accompanying drawings.

BRIEF DESCRIPTION OF THE DRAWINGS

FIG. 26 is a sectional view showing a first conventional channel stop structure, FIG. 27 is a sectional view showing a second conventional channel stop structure.

DESCRIPTION OF THE PREFERRED EMBODIMENTS

First Embodiment

Figure 1:
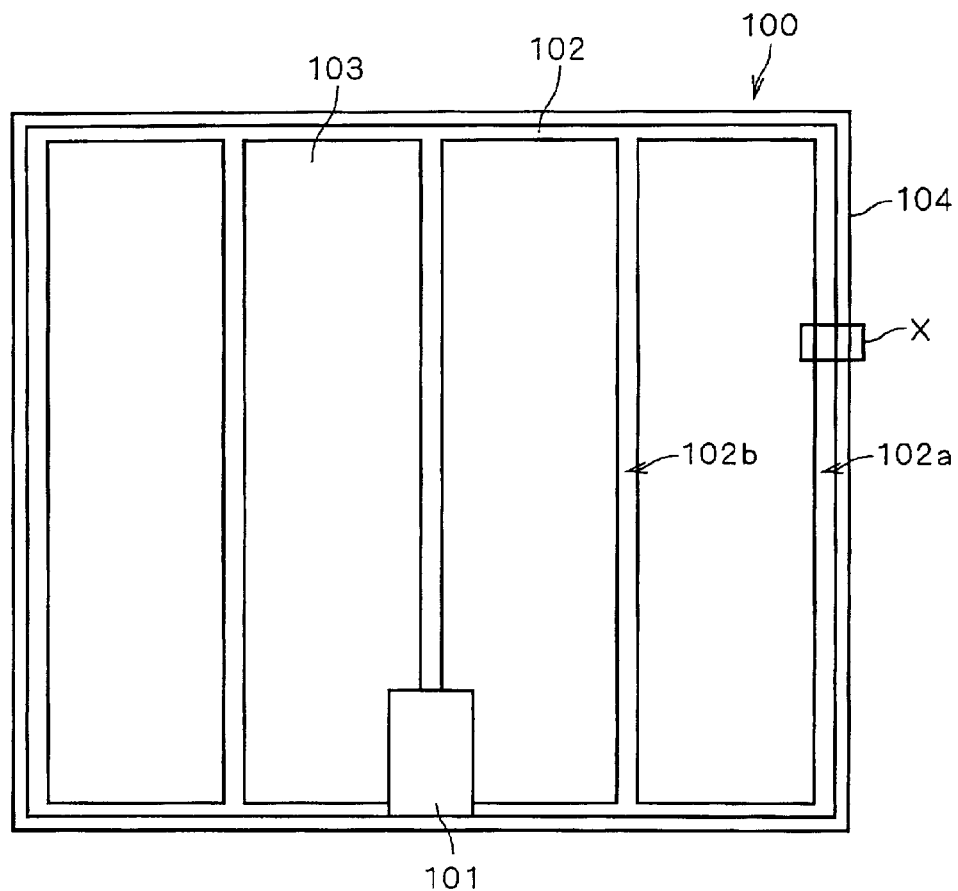
FIG. 1 is a top view typically showing a structure of a chip in which a power device is formed.

FIG. 1 is a top view typically showing a structure of a chip 100 in which a power device is formed. A gate pad 101 is formed in a predetermined portion on the chip 100 and is connected to a gate wiring 102. The gate wiring 102 includes a wiring 102a formed like a frame along a periphery of the chip 100 and a plurality of wirings 102b which are extended in a predetermined direction (a vertical direction of a paper) in a region 103 surrounded by the frame of the wiring 102a, have both ends connected to the wiring 102a and are provided at regular intervals in parallel with each other. The wiring 102a is formed slightly on the inside of an edge 104 of the chip 100.

Figure 2:
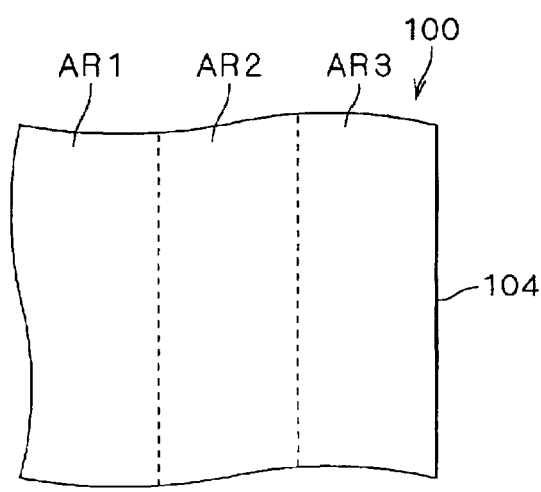
FIG. 2 is a top view showing an enlarged structure in the vicinity of an edge of the chip illustrated in FIG. 1.

FIG. 2 is a top view showing an enlarged structure of a region X illustrated in FIG. 1, that is, the vicinity of the edge 104 of the chip 100. A region AR1 is provided with the power device. A region AR2 adjacent to the region AR1 on the edge 104 side has a structure for relaxing an electric field of a main junction. A region AR3 including the edge 104 has a channel stop structure formed therein.

Figure 3:
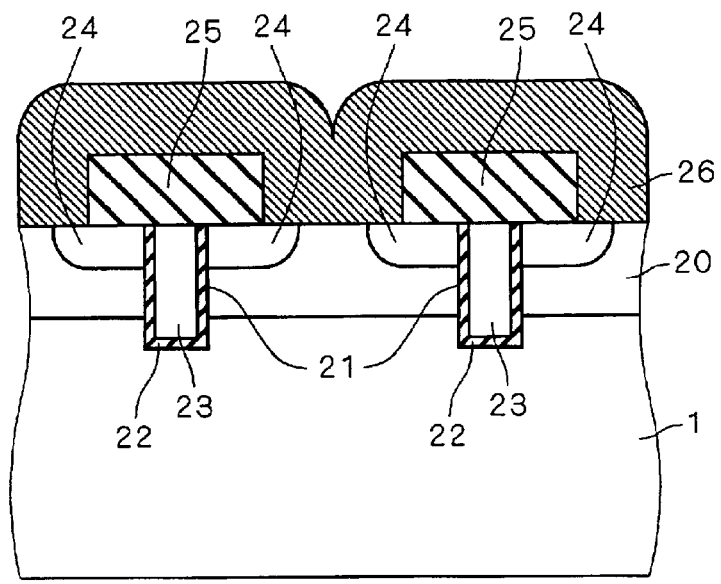
FIG. 3 is a sectional view showing a structure of the power device formed in the chip illustrated in FIG. 1.

FIG. 3 is a sectional view showing a structure of the power device formed in the region AR1 illustrated in FIG. 2. FIG. 3 shows two power MOSFETs which are adjacent to each other. Moreover, while the power MOSFET is shown as an example of the power device in FIG. 3, another power device such as an insulated gate type bipolar transistor may be formed.

As shown in FIG. 3, the power MOSFET comprises (a) a P-type impurity implantation region 20 having an impurity such as boron implanted therein which is formed in an upper surface of an N⁻-type silicon substrate 1 and constitutes a main junction together with the N⁻-type silicon substrate 1, (b) an N⁺-type source region (an emitter region in a bipolar transistor) 24 which is shallower than the P-type impurity implantation region 20 and is formed in the upper surface of the N⁻-type silicon substrate 1, (c) a trench 21 formed more deeply than the P-type impurity implantation region 20 in the upper surface of the N⁻-type silicon substrate 1 in a portion where the source region 24 is formed, (d) a silicon oxide film 22 formed on an inner wall of the trench 21 and functioning as a gate insulating film of the power MOSFET, and (e) a polysilicon film 23 formed to fill in the trench 21. The polysilicon film 23 functions as a gate electrode of the power MOSFET and corresponds to the wiring 102b shown in FIG. 1. While the N-channel power MOSFET is shown in FIG. 3, a P-channel power MOSFET may be formed.

Moreover, a silicon oxide film 25 is formed on the upper surface of the N⁻-type silicon substrate 1 to cover an upper surface of the polysilicon film 23. A part of an upper surface of the source region 24 is exposed from the silicon oxide film 25. An aluminum electrode 26 is formed on the upper surface of the N⁻-type silicon substrate 1 to cover the silicon oxide film 25. The aluminum electrode 26 is provided in contact with the upper surface of the source region 24 in the portion exposed from the silicon oxide film 25.

Figure 4:
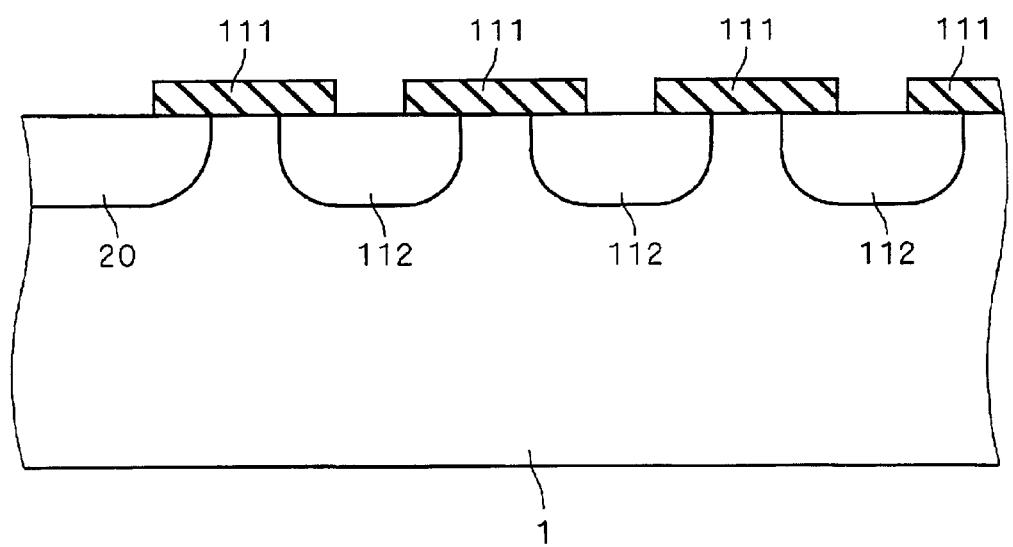
FIG. 4 is a sectional view showing a guard ring structure formed in the chip illustrated in FIG. 1.

FIG. 4 is a sectional view showing a guard ring structure as a first example of the structure formed in the region AR2 illustrated in FIG. 2. A plurality of P-type impurity implantation regions 112 are formed apart from each other in the upper surface of the N⁻-type silicon substrate 1. Moreover, a plurality of silicon oxide films 111 are formed apart from each other on the upper surface of the N⁻-type silicon substrate 1.

Figure 5:
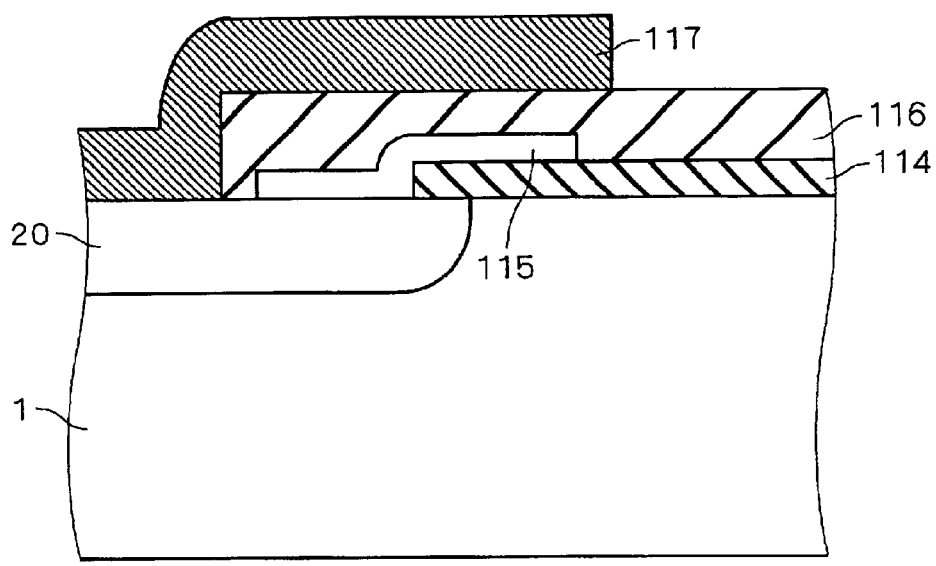
FIG. 5 is a sectional view showing a field plate structure formed in the chip illustrated in FIG. 1.

FIG. 5 is a sectional view showing a field plate structure as a second example of a structure formed in the region AR2 illustrated in FIG. 2. A silicon oxide film 114 is formed on the upper surface of the N⁻-type silicon substrate 1. Moreover, a polysilicon film 115 is formed on the P-type impurity implantation region 20 over the upper surface of the N⁻-type silicon substrate 1 in a portion exposed from the silicon oxide film 114. The polysilicon film 115 is also extended over the silicon oxide film 114 to constitute a field plate. A silicon oxide film 116 is formed on the N⁻-type silicon substrate 1 to cover the polysilicon film 115 and the silicon oxide film 114. Moreover, an aluminum electrode 117 is formed on the N⁻-type silicon substrate 1 in a portion exposed from the silicon oxide film 116 and is also extended over the silicon oxide film 116.

Figure 6:
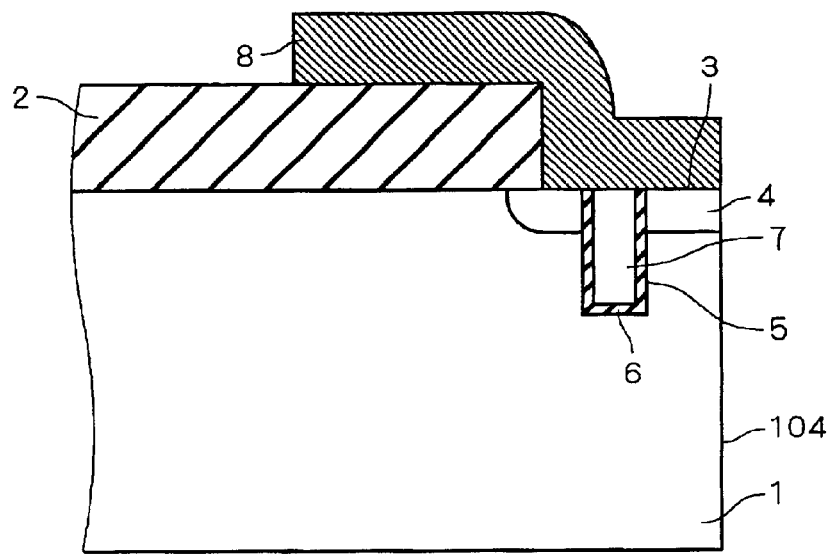
FIG. 6 is a sectional view showing a channel stop structure according to a first embodiment of the present invention.

FIG. 6 is a sectional view showing the channel stop structure according to a first embodiment of the present invention which is formed in the region AR3 illustrated in FIG. 2. A silicon oxide film 2 is formed on the upper surface of the N⁻-type silicon substrate 1 excluding the peripheral portion of the chip. An N⁺-type impurity implantation region 4 is formed in an upper surface 3 of the N⁻-type silicon substrate 1 in a portion exposed from the silicon oxide film 2.

A deeper trench 5 than the N⁺-type impurity implantation region 4 is formed in the upper surface 3 of the N⁻-type silicon substrate 1. A thin silicon oxide film 6 is formed on an inner wall (a side wall and a bottom wall) of the trench 5. Moreover, a polysilicon film 7 is formed to fill in the trench 5 having the silicon oxide film 6 provided thereon. An aluminum electrode 8 is formed on the upper surface 3 of the N⁻-type silicon substrate 1. The aluminum electrode 8 is provided in contact with an upper surface of the polysilicon film 7 and the upper surface 3 of the N⁻-type silicon substrate 1. Moreover, the aluminum electrode 8 is extended over the silicon oxide film 2 to constitute a field plate.

Figure 7:
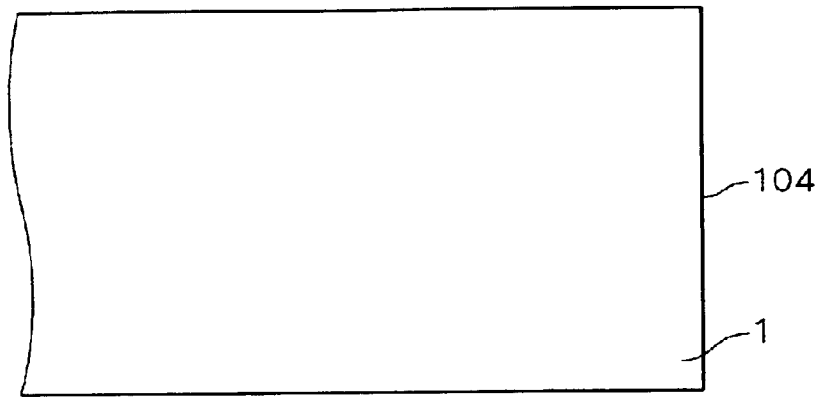
FIGS. 7 to 10 are sectional views showing, in order of steps, a method of forming the channel stop structure according to the first embodiment of the present invention.
Figure 8:
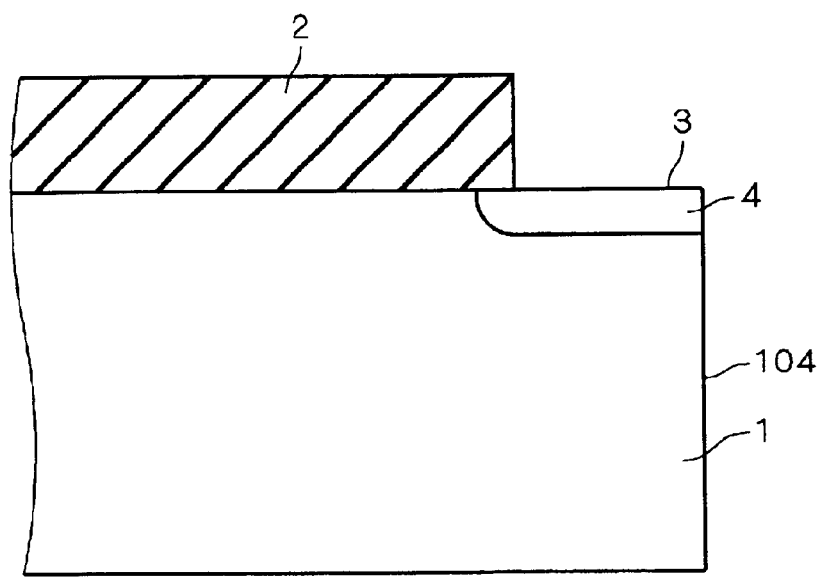

FIGS. 7 to 10 are sectional views showing, in order of steps, a method of forming a channel stop structure according to the first embodiment of the present invention. With reference to FIG. 7, first of all, the N⁻-type silicon substrate 1 is prepared. With reference to FIG. 8, next, a silicon oxide film is formed over the whole upper surface of the N⁻-type silicon substrate 1 by a CVD method. Then, the silicon oxide film is subjected to patterning by photolithography and anisotropic dry etching. Consequently, the silicon oxide film 2 is formed and the upper surface 3 of the N⁻-type silicon substrate 1 is exposed. Thereafter, an impurity such as phosphorus or arsenic is implanted into the upper surface 3 of the N⁻-type silicon substrate 1 by ion implantation using the silicon oxide film 2 as an etching mask. Subsequently, the implanted impurity is thermally diffused to form the N⁺-type impurity implantation region 4 in the upper surface 3 of the N⁻-type silicon substrate 1.

Figure 9:
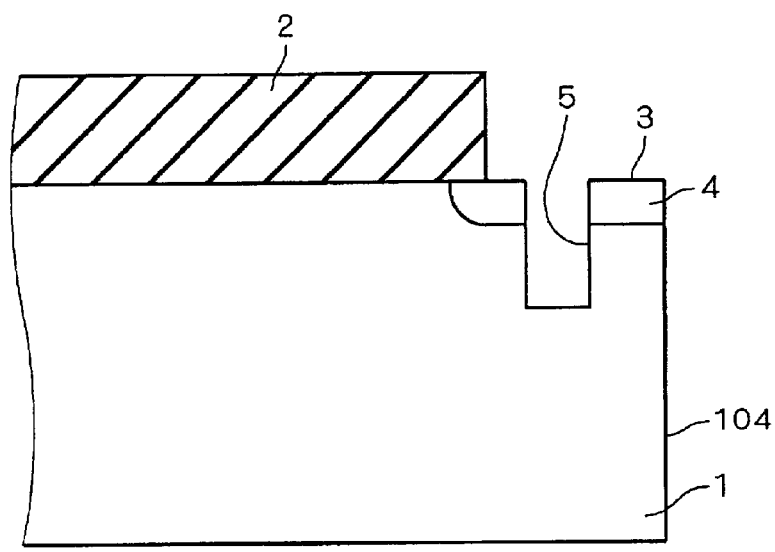
Figure 10:
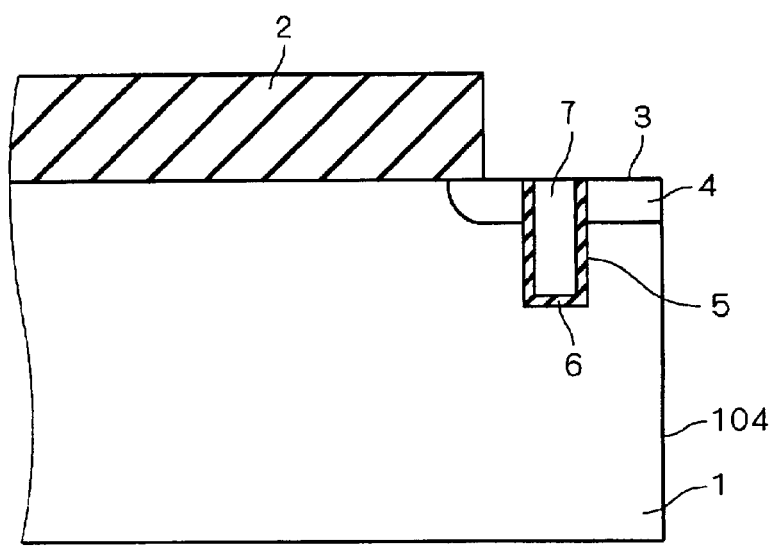

With reference to FIG. 9, next, the deeper trench 5 than the N⁺-type impurity implantation region 4 is formed in the upper surface 3 of the N⁻-type silicon substrate 1 by the photolithography and the anisotropic dry etching. With reference to FIG. 10, then, the inner wall of the trench 5 is thermally oxidized to form the silicon oxide film 6. By the CVD method, thereafter, a polysilicon film is formed over the whole surface in such a thickness as to fill in the trench 5. Subsequently, the polysilicon film is removed by etching until the upper surface 3 of the N⁻-type silicon substrate 1 is exposed. Consequently, only the polysilicon film in the portion formed in the trench 5 is not etched but remains so that the polysilicon film 7 to fill in the trench 5 is formed.

Next, an aluminum film is formed over the whole surface by sputtering and is subjected to patterning by the photolithography and the anisotropic dry etching. Consequently, the aluminum electrode 8 is formed so that the structure shown in FIG. 6 is obtained.

Description will be given to the result of a simulation which is obtained by verification for the effect of the channel stop structure according to the first embodiment. FIGS. 11 to 14 are sectional views showing structures used in the simulation.

Figure 11:
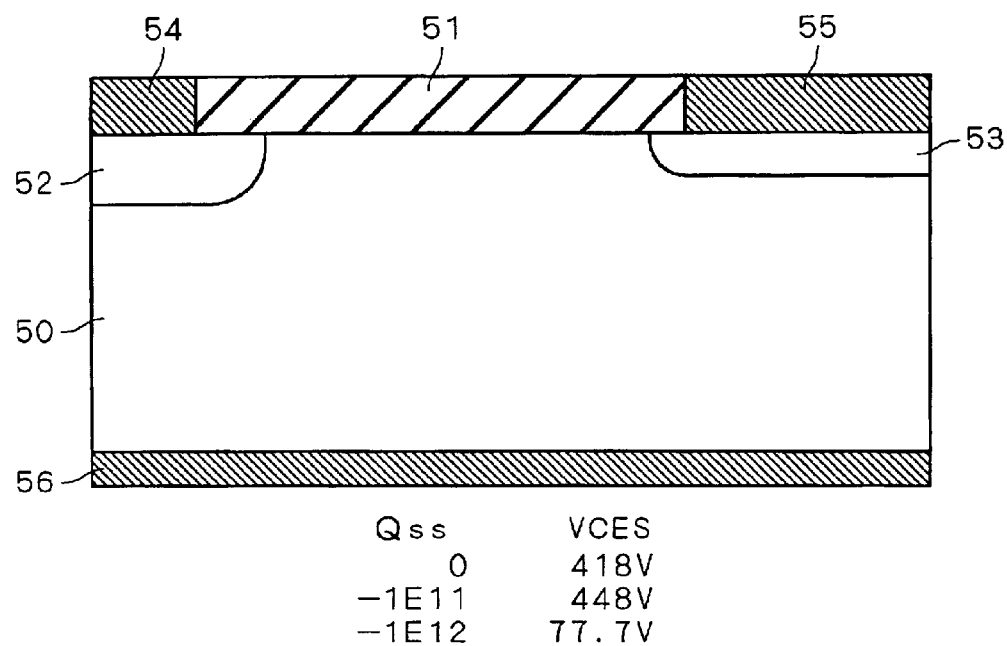
FIGS. 11 to 14 are sectional views showing a structure used in a simulation.

The structure shown in FIG. 11 corresponds to the conventional channel stop structure shown in FIG. 26. A P-type impurity implantation region 52 constituting a main junction and an N⁺-type impurity implantation region 53 corresponding to the N⁺-type impurity implantation region 152 are formed in the upper surface of the N⁻-type silicon substrate 50. The P-type impurity implantation region 52 and the N⁺-type impurity implantation region 53 are formed apart from each other by a distance of 50 μm. The N⁺-type impurity implantation region 53 has an implantation concentration of 5E13 cm⁻³. An electrode 54 and an electrode 55 are formed in contact with the P-type impurity implantation region 52 and the N⁺-type impurity implantation region 53 over the upper surface of the N⁻-type silicon substrate 50 respectively, and a silicon oxide film 51 is formed between both electrodes. Moreover, an electrode 56 is formed on a back face of the N⁻-type silicon substrate 50.

Figure 12:
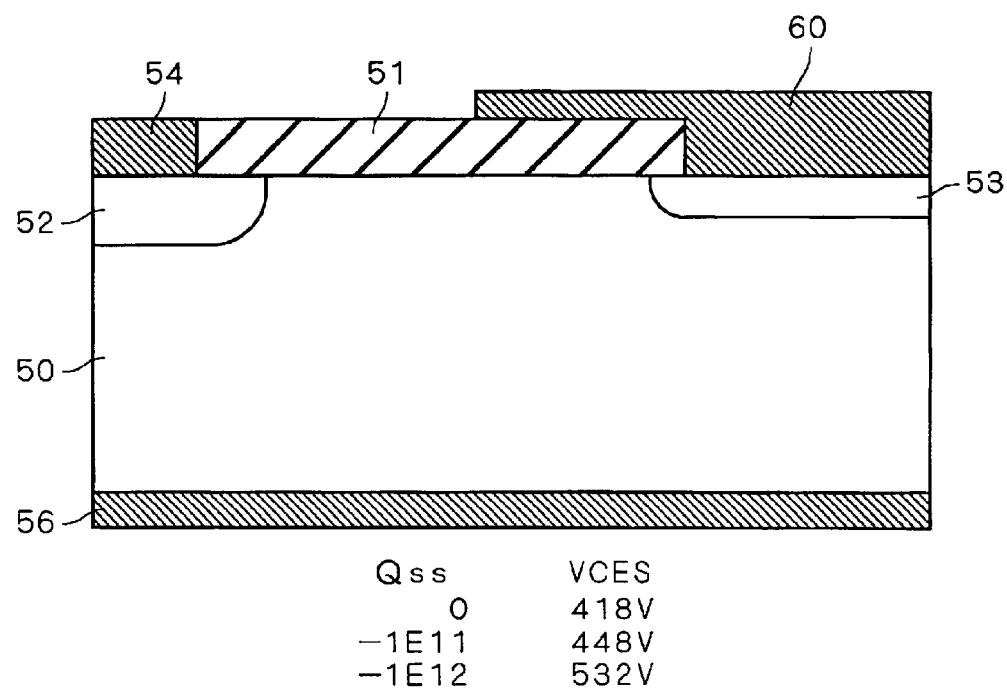

The structure shown in FIG. 12 corresponds to the conventional channel stop structure shown in FIG. 27. In place of the electrode 55 shown in FIG. 11, an electrode 60 constituting a field plate is extended over the silicon oxide film 51.

Figure 13:
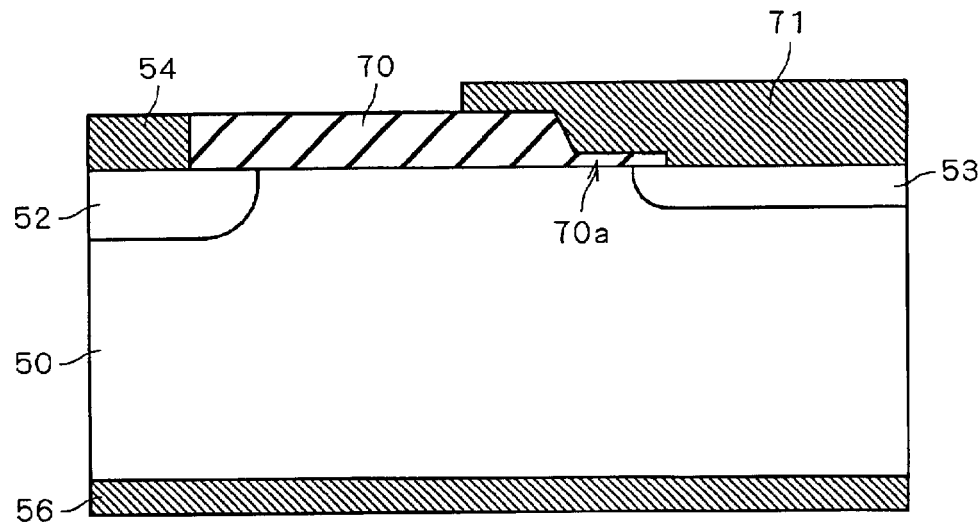
Figure 29:
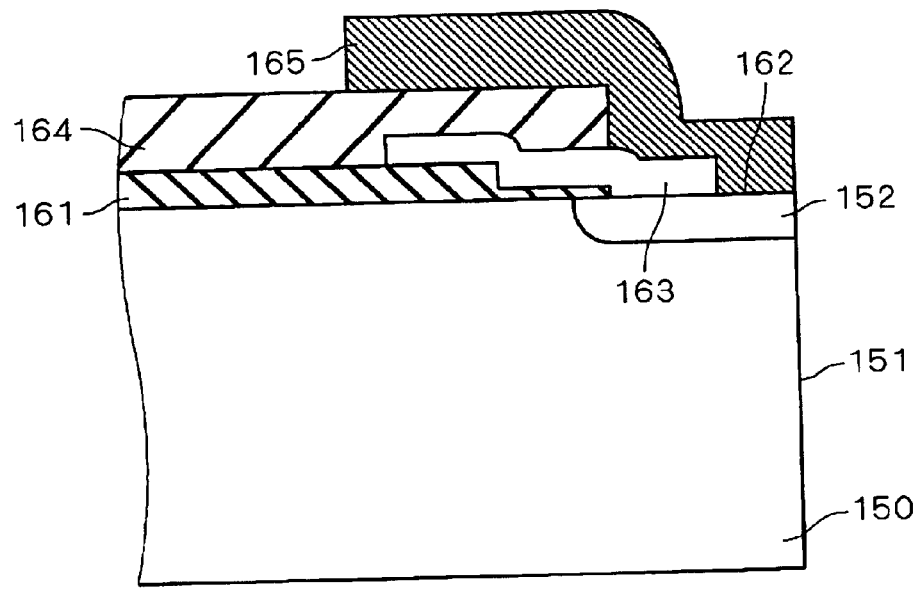
FIG. 29 is a sectional view showing a fourth conventional channel stop structure.
Figure 30:
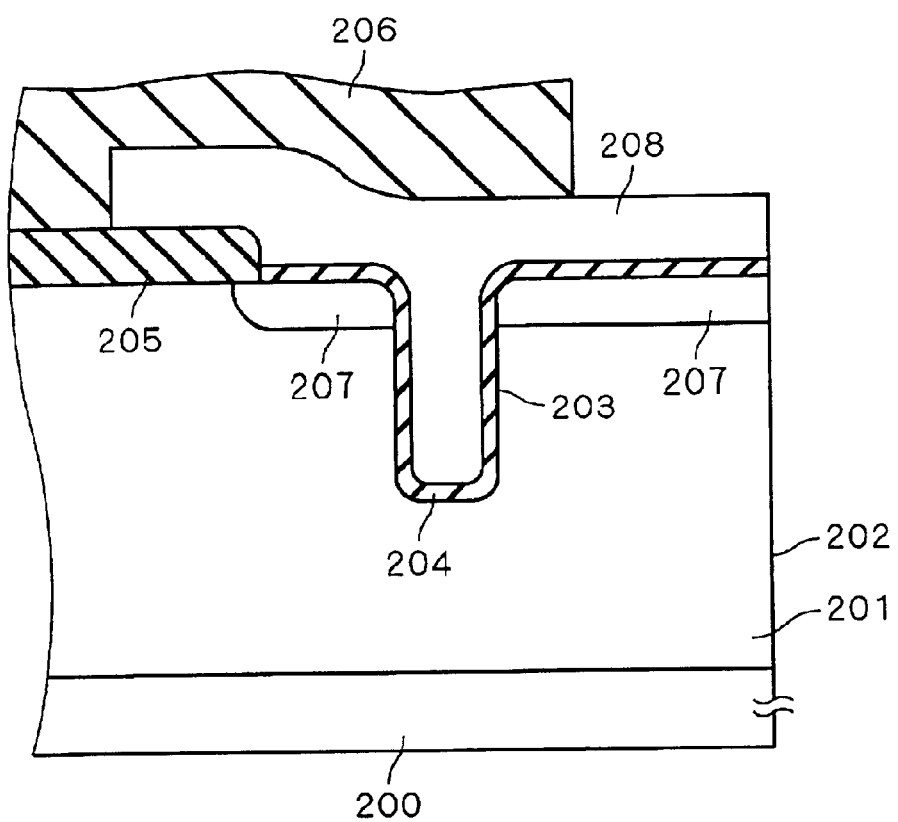
FIG. 30 is a sectional view showing a fifth conventional channel stop structure.

The structure shown in FIG. 13 is similar to the conventional channel stop structure shown in FIG. 29. In place of the silicon oxide film 51 shown in FIG. 11, a silicon oxide film 70 having a thin film portion 70a is formed on an end at the N⁺-type impurity implantation region 53 side. In place of the electrode 55 shown in FIG. 11, a stepped electrode 71 constituting a field plate is extended over the silicon oxide film 70.

Figure 14:
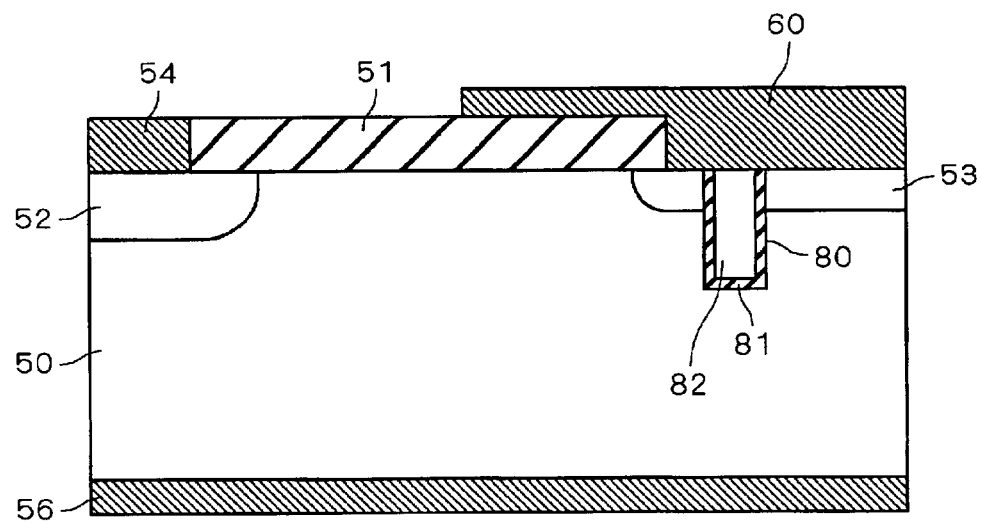

The structure shown in FIG. 14 corresponds to the channel stop structure according to the first embodiment. A trench 80, a silicon oxide film 81 and a polysilicon film 82 are formed corresponding to the trench 5, the silicon oxide film 6 and the polysilicon film 7 shown in FIG. 6 in the upper surface of the N⁻-type silicon substrate 50 in a portion where the N⁺-type impurity implantation region 53 is formed, respectively. In place of the electrode 55 shown in FIG. 11, moreover, the electrode 60 constituting a field plate is extended over the silicon oxide film 51.

Referring to each of the structures shown in FIGS. 11 to 14, an electric charge quantity Qss in the surface of the N⁻-type silicon substrate 50 is changed in three stages (0, −1E11, −1E12) to measure a breakdown voltage VCES in each state. FIGS. 11 to 14 show the results of the simulation together.

As is apparent from the result of the simulation shown in each drawing, if Qss is 0 or −1E11, VCES is almost equal in all the structures. The reason is that a breakdown voltage is determined by a curvature of the depletion layer of the main junction if Qss is 0 or −1E11.

On the other hand, if Qss is −1E12, VCES is extremely reduced in the conventional structure shown in FIG. 11. The reason is that the depletion layer of the main junction is extended up to the N⁺-type impurity implantation region 53 and an electric field of the N⁺-type impurity implantation region 53 is thereby raised, resulting in a drop in the breakdown voltage. To the contrary, referring to the conventional structures shown in FIGS. 12 and 13, VCES is raised if Qss is −1E12. The reason is that the extension of the depletion layer of the main junction is suppressed by the field plate. Moreover, it is also apparent that the extent of a rise in VCES in the conventional structure shown in FIG. 13 in which the stepped electrode 71 is formed is higher than that of the conventional structure shown in FIG. 12.

Referring to the structure shown in FIG. 14, if Qss is −1E12, VCES is higher than that of each of the conventional structures shown in FIGS. 12 and 13. As is apparent from a comparison of FIG. 12 with FIG. 14, the trench 80 having the silicon oxide film 81 and the polysilicon film 82 formed therein is added so that VCES is raised by approximately 70 V. More specifically, the result of the simulation indicates that the formation of the trench 5 suppresses the extension of the depletion layer from the main junction.

Figure 15:
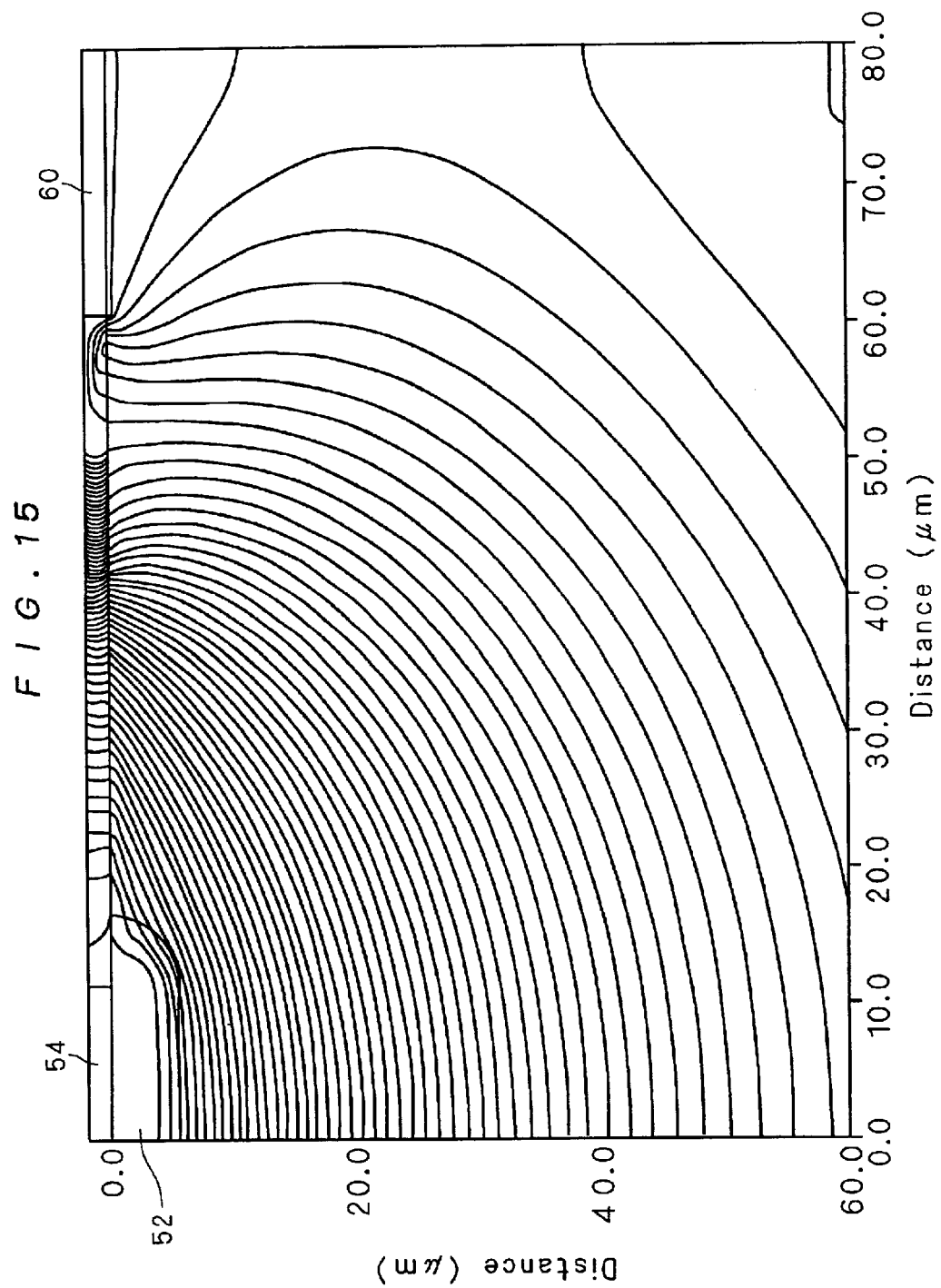
FIG. 15 is a chart showing a potential distribution with Qss=−1E12 and VCES=500 V corresponding to the structure illustrated in FIG. 12.
Figure 16:
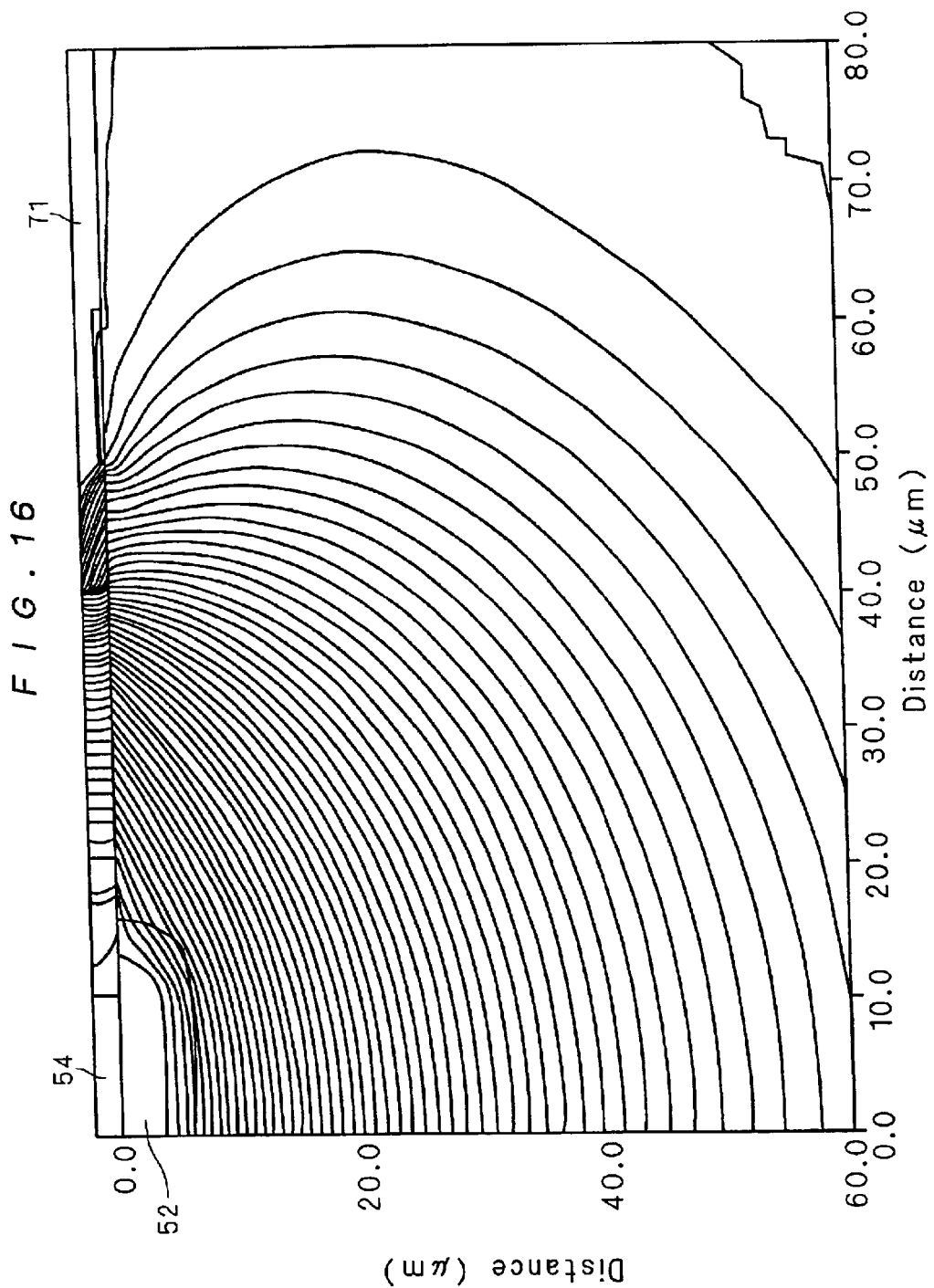
FIG. 16 is a chart showing a potential distribution with Qss=−1E12 and VCES=500 V corresponding to the structure illustrated in FIG. 13.
Figure 17:
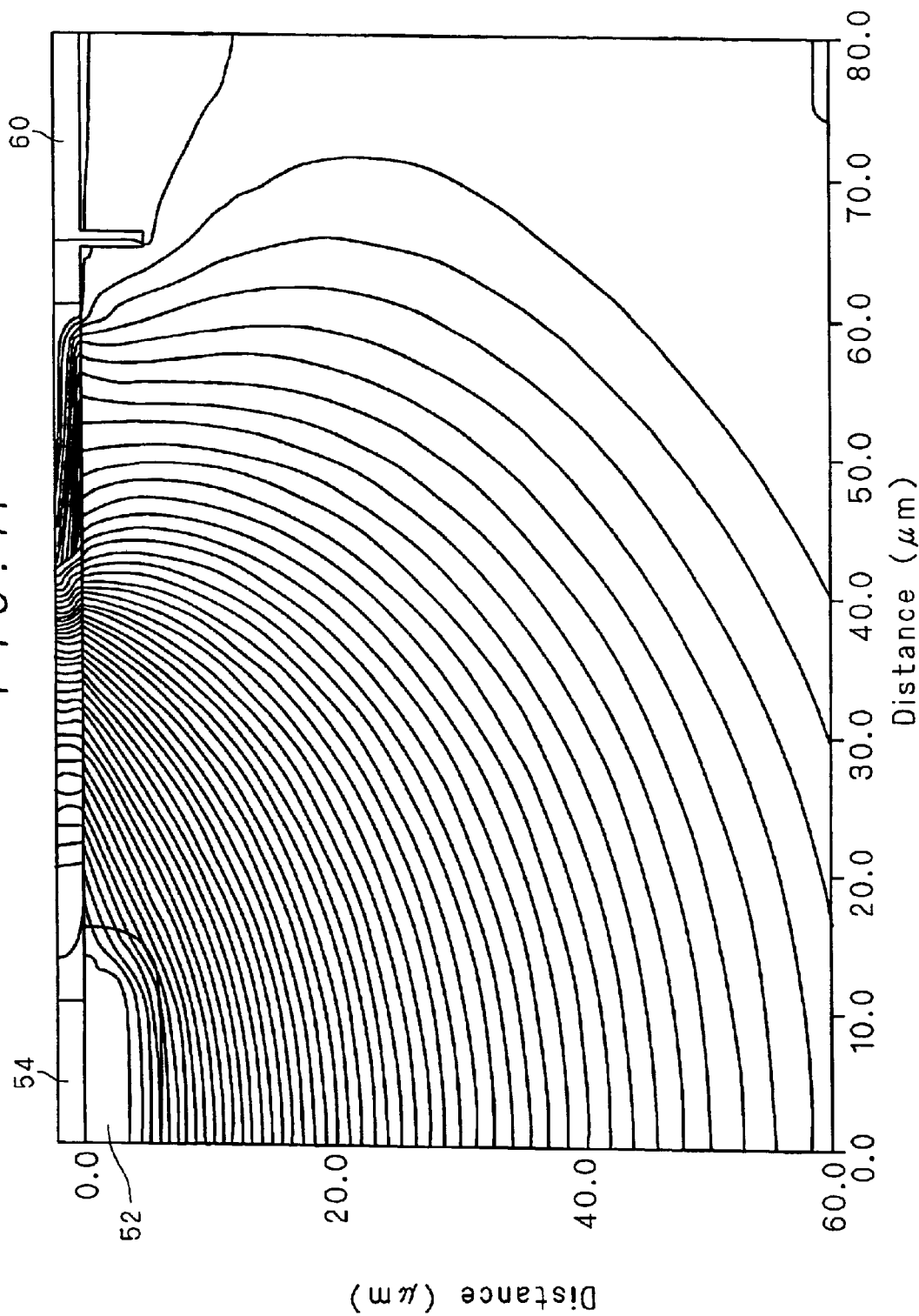
FIG. 17 is a chart showing a potential distribution with Qss=−1E12 and VCES=500 V corresponding to the structure illustrated in FIG. 14.

The effect of the semiconductor device according to the first embodiment will be verified in more detail. FIGS. 15 to 17 are charts showing a potential distribution with Qss=−1E12 and VCES=500 V corresponding to the structures shown in FIGS. 12 to 14, respectively. With reference to FIG. 15, in the structure shown in FIG. 12, it is apparent that an electric field is suppressed by the field plate constituted by the electrode 60. With reference to FIG. 16, in the structure shown in FIG. 13, it is apparent that an electric field is suppressed by the field plate constituted by the electrode 71. In both of the structures shown in FIGS. 12 and 13, however, the electric field is suppressed by only a surface. On the other hand, with reference to FIG. 17, it is apparent that the electric field is suppressed three-dimensionally by the field plate constituted by the electrode 60 and the trench 80 in the structure shown in FIG. 14. In the semiconductor device described in the Japanese Patent Application Laid-Open No. 8-264787 (1996) disclosed in the description of the conventional art, the channeling in the upper surface of the P⁻-type epitaxial layer 201 is an object. The channeling progresses along an interface of silicon and an insulating layer. Therefore, the three-dimensional effect in the semiconductor device according to the first embodiment has not been disclosed.

According to the semiconductor device and the method of manufacturing the semiconductor device in accordance with the first embodiment, thus, the channel stop structure formed by using the N⁻-type silicon substrate 1 has the trench 5 as well as the N⁺-type impurity implantation region 4. Consequently, it is possible to three-dimensionally suppress, through the trench 5, the depletion layer extended from the main junction toward the edge 104 of the chip. Thus, the breakdown voltage of the semiconductor device can be stabilized.

Second Embodiment

Figure 18:
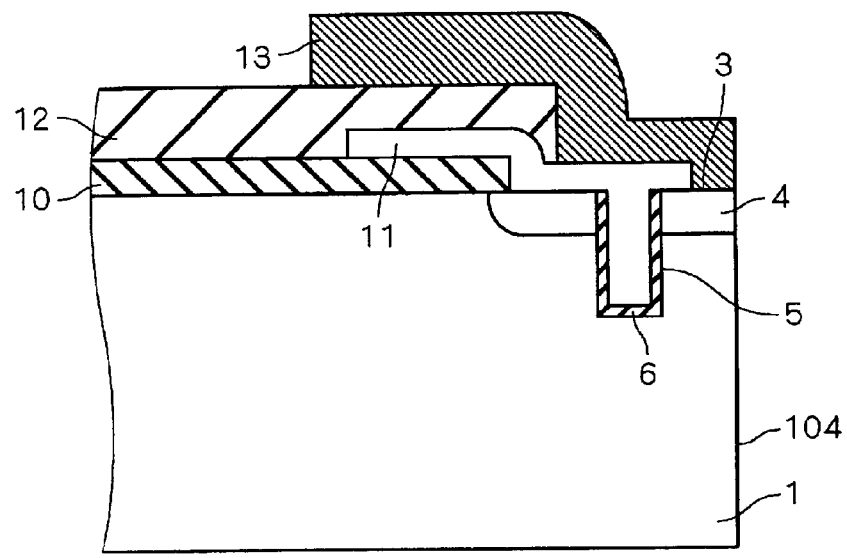
FIG. 18 is a sectional view showing a channel stop structure according to a second embodiment of the present invention.

FIG. 18 is a sectional view showing a channel stop structure according to a second embodiment of the present invention. A silicon oxide film 10 is formed on an upper surface of an N⁻-type silicon substrate 1 excluding a peripheral portion of a chip. An N⁺-type impurity implantation region 4 is formed in an upper surface 3 of the N⁻-type silicon substrate 1 in a portion exposed from the silicon oxide film 10. A deeper trench 5 than the N⁺-type impurity implantation region 4 is formed in the upper surface 3 of the N⁻-type silicon substrate 1. A thin silicon oxide film 6 is formed on an inner wall of the trench 5. Moreover, a polysilicon film 11 is formed to fill in the trench 5 provided with the silicon oxide film 6. The polysilicon film 11 is extended over the upper surface 3 of the N⁻-type silicon substrate 1 and over the silicon oxide film 10 toward a main junction, thereby constituting a first field plate. A part (the most peripheral portion) of the upper surface 3 of the N⁻-type silicon substrate 1 is exposed from the polysilicon film 11.

Moreover, a silicon oxide film 12 is provided on the polysilicon film 11 in a portion formed on the silicon oxide film 10 and on the silicon oxide film 10 in a portion where the polysilicon film 11 is not formed. An aluminum electrode 13 is formed on the most peripheral portion of the upper surface 3 of the N⁻-type silicon substrate 1. The aluminum electrode 13 is also provided in contact with the polysilicon film 11, and furthermore, is extended over the silicon oxide film 12 toward the main junction, thereby constituting a second field plate.

According to the semiconductor device in accordance with the second embodiment, thus, the polysilicon film 11 to function as the first field plate is formed in the channel stop structure. As compared with the channel stop structure according to the first embodiment, therefore, it is possible to enhance the effect of suppressing a depletion layer extended from the main junction toward an edge 104 of the chip. Thus, it is possible to further stabilize a breakdown voltage of the semiconductor device.

Third Embodiment

Figure 19:
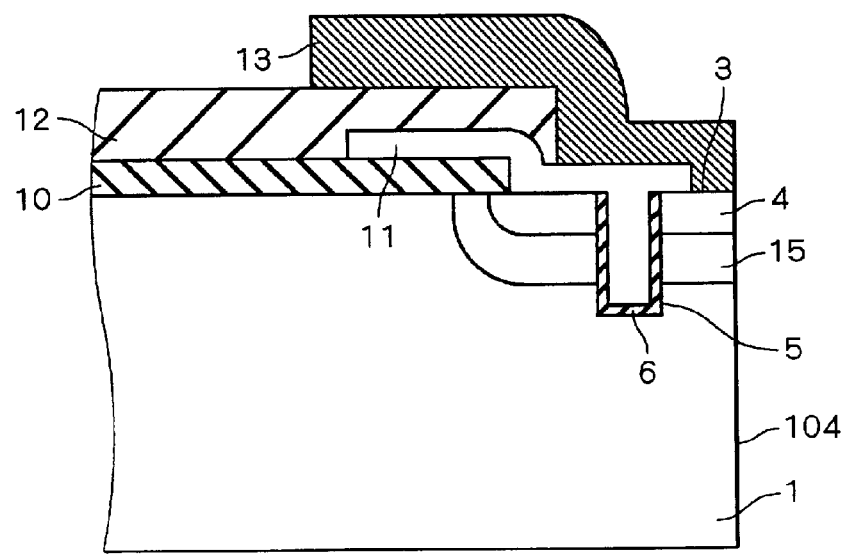
FIG. 19 is a sectional view showing a channel stop structure according to a third embodiment of the present invention.

FIG. 19 is a sectional view showing a channel stop structure according to a third embodiment of the present invention. The channel stop structure according to the third embodiment is obtained by adding a P-type impurity implantation region 15 to the channel stop structure according to the second embodiment shown in FIG. 18. The P-type impurity implantation region 15 is formed more deeply than an N⁺-type impurity implantation region 4 and more shallowly than a trench 5 in an upper surface 3 of an N⁻-type silicon substrate 1.

Figure 20:
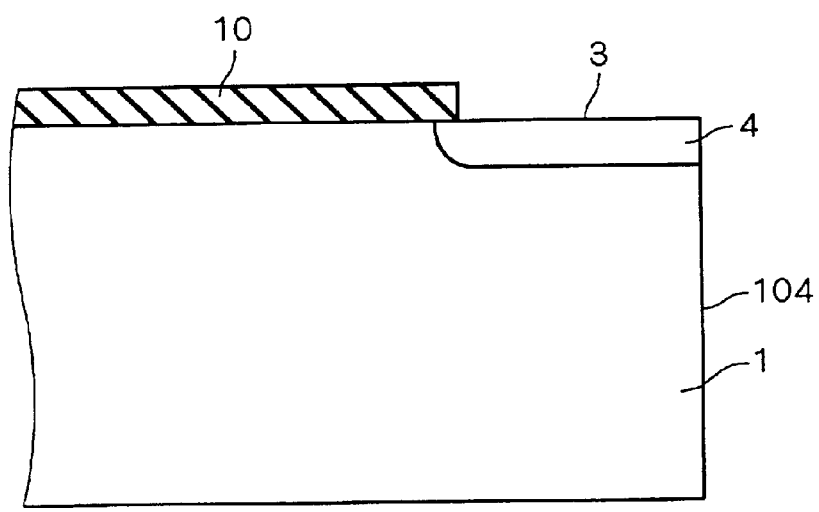
FIGS. 20 to 25 are sectional views showing, in order of steps, a method of forming the channel stop structure according to the third embodiment of the present invention.

FIGS. 20 to 25 are sectional views showing, in order of steps, a method of forming the channel stop structure according to the third embodiment. Description will be properly given with reference to FIG. 3. With reference to FIG. 20, first of all, the N⁻-type silicon substrate 1 is prepared. Next, a silicon oxide film 10 is formed on the upper surface of the N⁻-type silicon substrate 1 by the same method as that in the first embodiment.

Subsequently, an impurity such as phosphorus or arsenic is implanted into the upper surface 3 of the N⁻-type silicon substrate 1 by ion implantation. At this time, a photoresist having a predetermined opening pattern is previously formed on the upper surface of the N⁻-type silicon substrate 1 in a region AR1 by photolithography so that ion implantation for forming a source region 24 of a power MOSFET is also carried out at the same step. By thermally diffusing the implanted impurity, next, the N⁺-type impurity implantation region 4 and the source region 24 which have depths equal to each other are formed in the upper surface of the N⁻-type silicon substrate 1. Then, the photoresist is removed.

Figure 21:
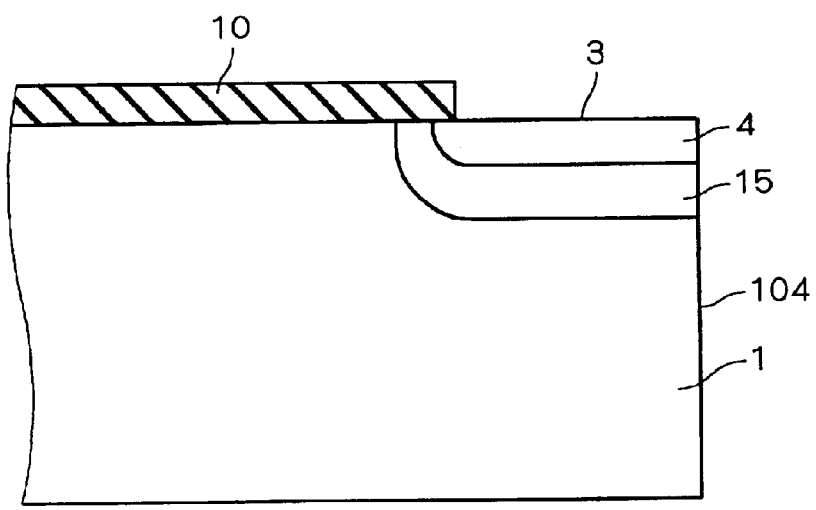

With reference to FIG. 21, next, an impurity such as boron is implanted into the upper surface 3 of the N⁻-type silicon substrate 1. At this time, a photoresist having a predetermined opening pattern is previously formed on the upper surface of the N⁻-type silicon substrate 1 by photolithography so that ion implantation for forming a P-type impurity implantation region 20 of the power MOSFET is also carried out at the same step. By thermally diffusing the implanted impurity, next, the P-type impurity implantation regions 15 and 20 having depths equal to each other are formed in the upper surface of the N⁻-type silicon substrate 1. Then, the photoresist is removed.

Figure 22:
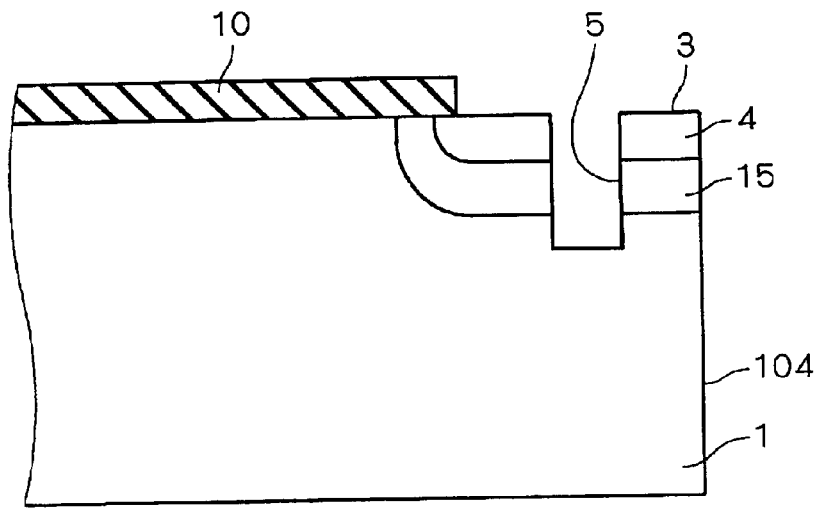

With reference to FIG. 22, next, the deeper trench 5 than the P-type impurity implantation region 15 is formed in the upper surface 3 of the N⁻-type silicon substrate 1 by photolithography and anisotropic dry etching. In addition, a deeper trench 21 than the P-type impurity implantation region 20 is formed in the upper surface of the N⁻-type silicon substrate 1 in the region AR1 at the same step. By setting an opening width of the trench 5 to be equal to that of the trench 21, the depths of the trenches 5 and 21 can be set to be equal to each other.

Figure 23:
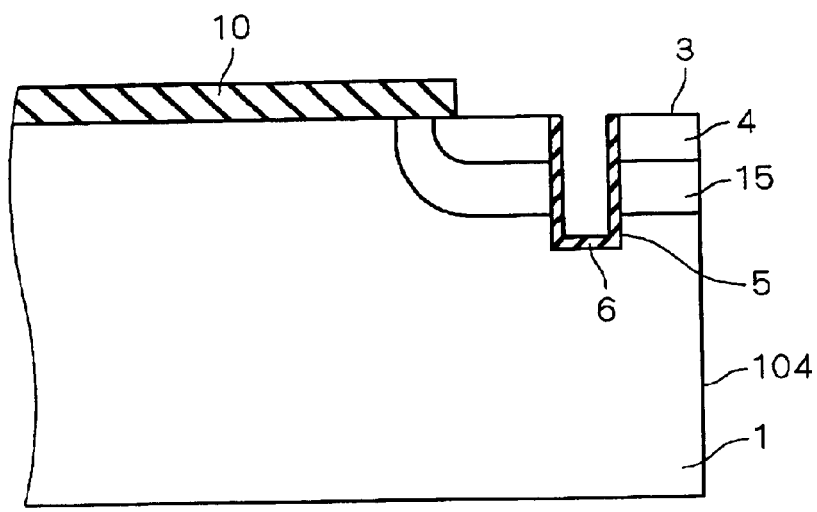

With reference to FIG. 23, then, an inner wall of the trench 5 is thermally oxidized to form a silicon oxide film 6. In addition, an inner wall of the trench 21 is thermally oxidized, thereby forming a silicon oxide film 22 at the same step.

Figure 24:
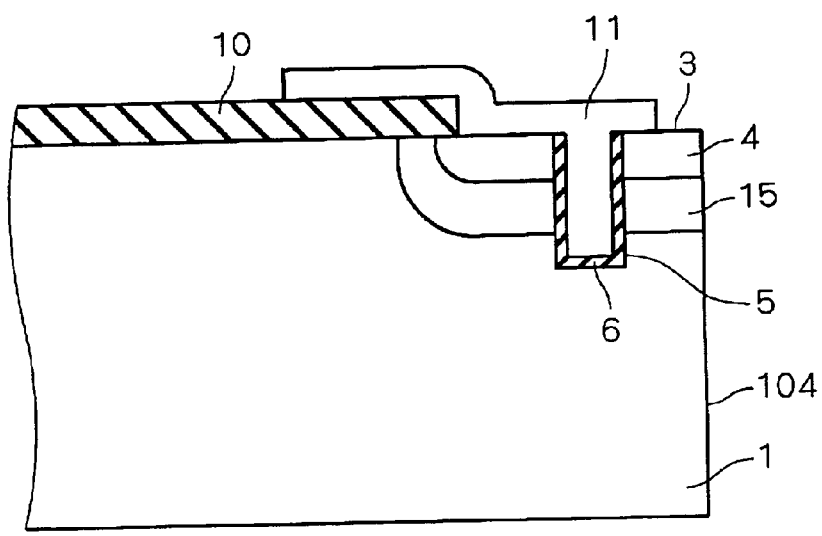

With reference to FIG. 24, thereafter, a polysilicon film is formed over the whole surface in such a thickness as to fill in the trenches 5 and 21 by a CVD method. Subsequently, the polysilicon film is subjected to patterning by the photolithography and the anisotropic dry etching. Consequently, a polysilicon film 11 is formed in a region AR3 and a polysilicon film 23 is formed in the region AR1.

Figure 25:
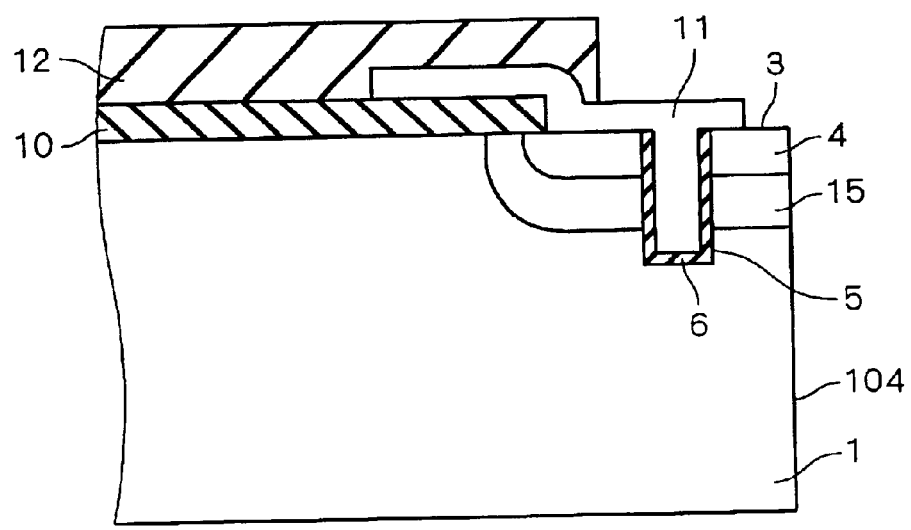
Figure 28:
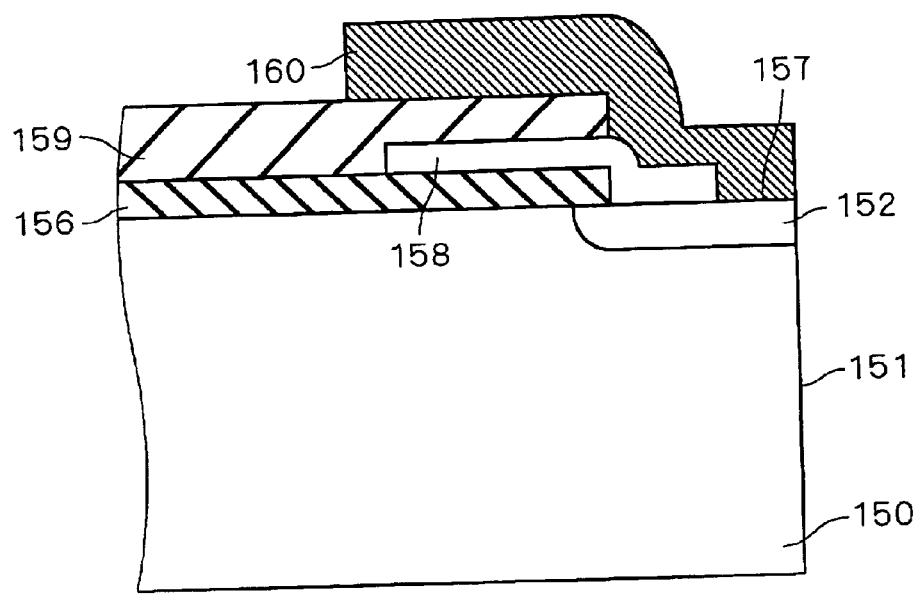
FIG. 28 is a sectional view showing a third conventional channel stop structure.

With reference to FIG. 25, next, a silicon oxide film is formed over the whole surface by the CVD method.

Subsequently, the silicon oxide film is subjected to patterning by the photolithography and the anisotropic dry etching. Consequently, a silicon oxide film 12 is formed in the region AR3 and a silicon oxide film 25 is formed in the region AR1.

Next, an aluminum film is formed over the whole surface by sputtering. Then, the aluminum film is subjected to patterning by the photolithography and the anisotropic dry etching. Consequently, an aluminum electrode 13 is formed in the region AR3 so that the structure shown in FIG. 19 is obtained. In addition, an aluminum electrode 26 is formed in the region AR1 so that the structure shown in FIG. 3 is obtained.

According to the method of manufacturing a semiconductor device in accordance with the third embodiment, thus, it is possible to simultaneously form the channel stop structure shown in FIG. 19 without an additional step at a series of steps of manufacturing the power MOSFET shown in FIG. 3. Consequently, a manufacturing cost can be reduced as compared with the case in which the channel stop structure is formed at a separate step from the steps of manufacturing the power MOSFET.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

an N-type semiconductor substrate;

a transistor having a first impurity introduced region of P-type formed in a main surface of said semiconductor substrate and constituting a main junction together with said semiconductor substrate; and a channel stop structure formed in a peripheral portion of said semiconductor substrate, said channel stop structure including, a first conductive film;

a second conductive film formed on said main surface of said semiconductor substrate and on said first conductive film, said second conductive film including a material different from that of said first conductive film and extending toward said main junction;

a first trench formed in said main surface of said semiconductor substrate; and a second impurity introduced region of N-type formed in said main surface of said semiconductor substrate in a portion where said first trench is formed and directly contacting said first trench, wherein said first trench is filled with said first conductive film, and a portion of said first conductive film is formed on said main surface of said semiconductor substrate, said portion of said first conductive film extending toward said main junction.

2. The semiconductor device according to claim 1, wherein said channel stop structure further has:

a first insulating film formed on an inner wall of said first trench.

3. The semiconductor device according to claim 2, wherein a material of said first conductive film is polysilicon.

4. The semiconductor device according to claim 2, wherein said transistor further has:

a third impurity introduced region of N-type formed in said main surface of said semiconductor substrate and functioning as a source or an emitter of said transistor;

a second trench formed in said main surface of said semiconductor substrate in a portion where said third impurity introduced region is formed;

a second insulating film formed on an inner wall of said second trench and functioning as a gate insulating film of said transistor; and a third conductive film formed to fill in said second trench and functioning as a gate electrode of said transistor, and wherein said channel stop structure further has a fourth impurity introduced region of P-type formed in said main surface of said semiconductor substrate.

5. The semiconductor device according to claim 4, wherein an opening width of said first trench is equal to that of said second trench.

6. The semiconductor device according to claim 4, wherein a material of said first conductive film is equal to that of said third conductive film.

7. The semiconductor device according to claim 1, wherein said portion of said first conductive film directly contacts said second impurity introduced region.

* * * * *